(12) United States Patent
Mashhour

(10) Patent No.: US 6,756,845 B1
(45) Date of Patent: Jun. 29, 2004

(54) METHOD AND SYSTEM FOR COMPENSATING NON-LINEARITIES AND TIME-VARYING CHANGES OF A TRANSFER FUNCTION ACTING ON AN INPUT SIGNAL

(75) Inventor: Ashkan Mashhour, Camberley (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/181,644

(22) PCT Filed: Jan. 26, 2000

(86) PCT No.: PCT/EP00/00579

§ 371 (c)(1),
(2), (4) Date: Sep. 3, 2002

(87) PCT Pub. No.: WO01/56146

PCT Pub. Date: Aug. 2, 2001

(51) Int. Cl.[7] ................................................ H03F 1/26
(52) U.S. Cl. ....................................... 330/149; 375/297
(58) Field of Search ............................. 330/149, 136, 330/129; 375/297; 455/63

(56) References Cited

U.S. PATENT DOCUMENTS

| 5,049,832 A | | 9/1991 | Cavers ........................ 330/149 |
| 5,862,460 A | * | 1/1999 | Rich .............................. 455/116 |
| 5,900,778 A | | 5/1999 | Stonick et al. .............. 330/149 |
| 6,121,831 A | * | 9/2000 | Mack ............................... 330/9 |
| 6,359,511 B1 | * | 3/2002 | Phanse et al. ............... 330/254 |

FOREIGN PATENT DOCUMENTS

EP      0 658 975 A1    12/1994       H03F/1/32

OTHER PUBLICATIONS

Michael Faulkner et al.; "Adaptive Linearisation Using Pre–Distortion", pp. 35–40, 1990 IEEE.

* cited by examiner

*Primary Examiner*—Henry Choe
(74) *Attorney, Agent, or Firm*—Cohen, Pontani, Lieberman & Pavane

(57) ABSTRACT

The described method and system are adapted to reduce the error between an ideally expected output signal and the actual output signal. The proposed adaptation algorithm is able to minimise, for instance in a system with a given transfer function, the error y-x between y=g(f(x)) and x, where g is an unknown and/or time-varing function and f the adaptive function for which the characteristic is changed to track g. The proposed adaptation algorithm updates not only the transfer function f at the current input value x, but also the transfer function f at other points corresponding to different input values. One of the applications for such an algorithm is digital predistortion where a transmitter's non-linear characteristic needs to be linearised, in an adaptive manner, since the characteristic exhibits slow changes with temperature, bias, ageing or the like.

32 Claims, 10 Drawing Sheets

Predistortion block diagram

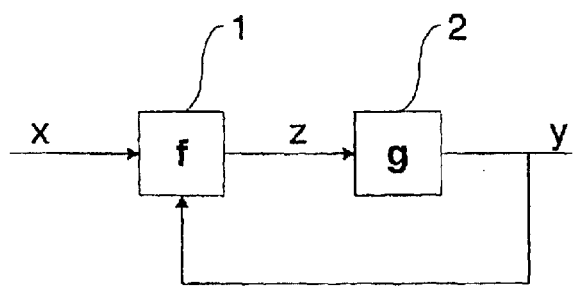
Figure 1: The functional system
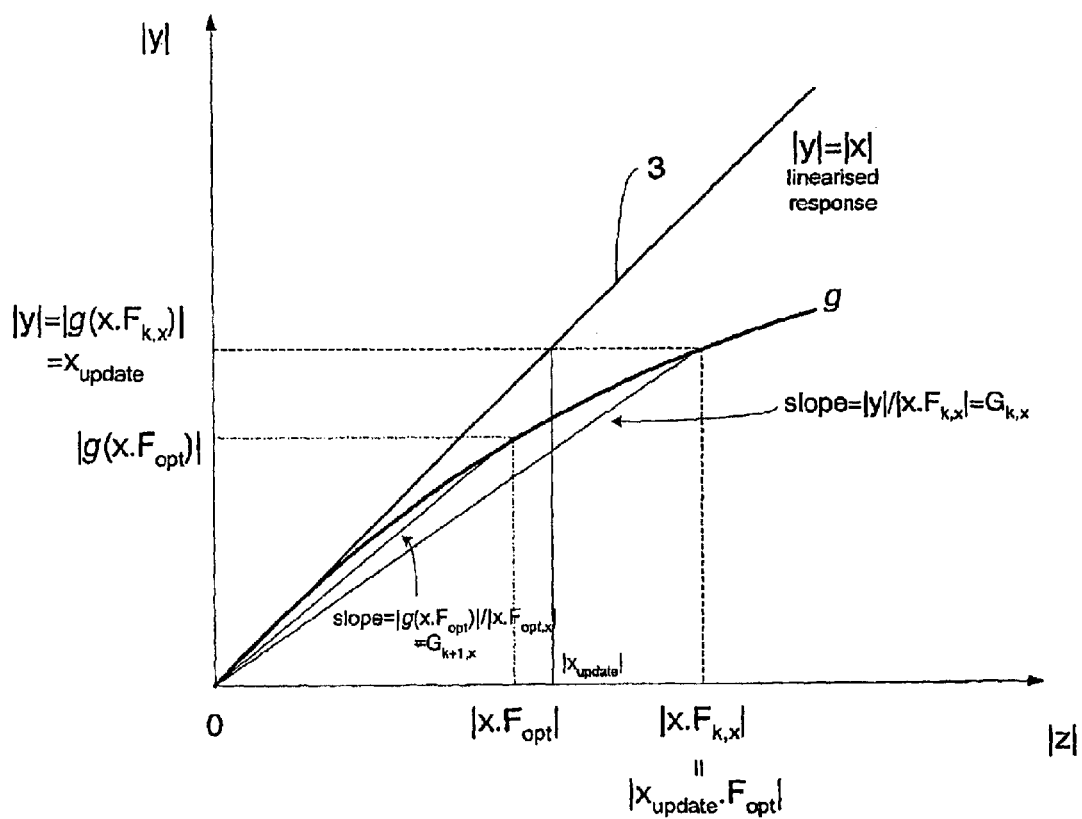
Figure 2: Illustration of the algorithm

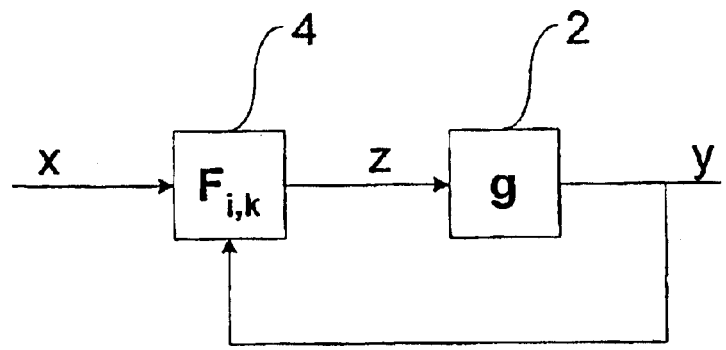
Figure 3: Practical system
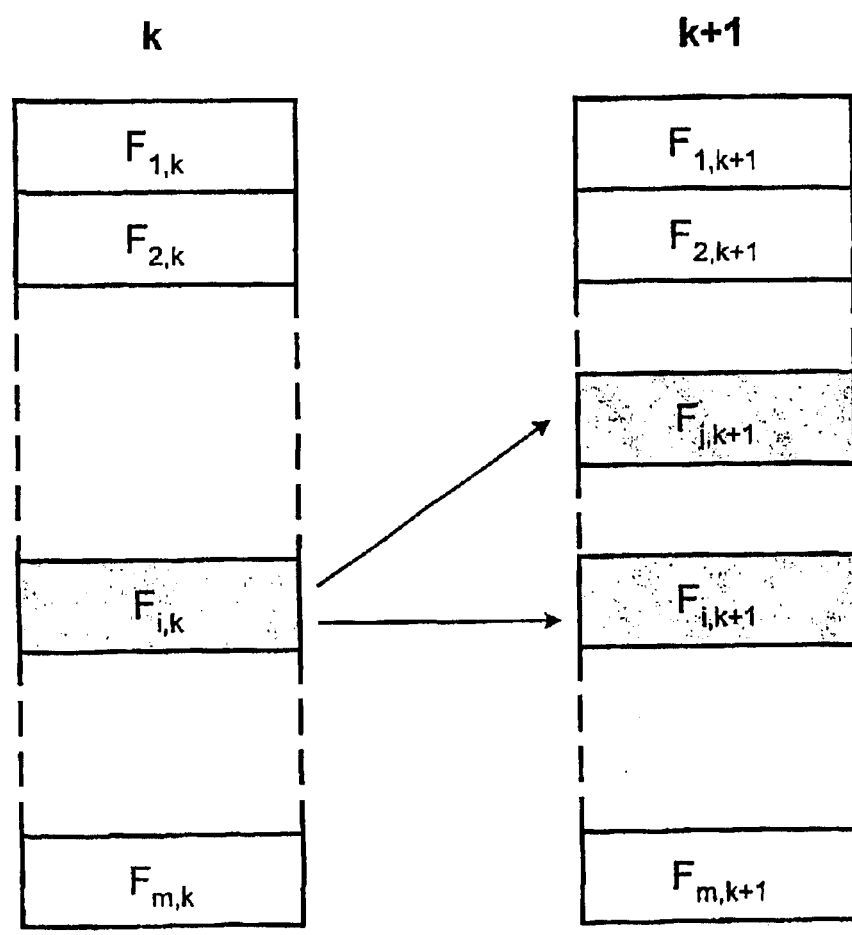
Figure 4: F table

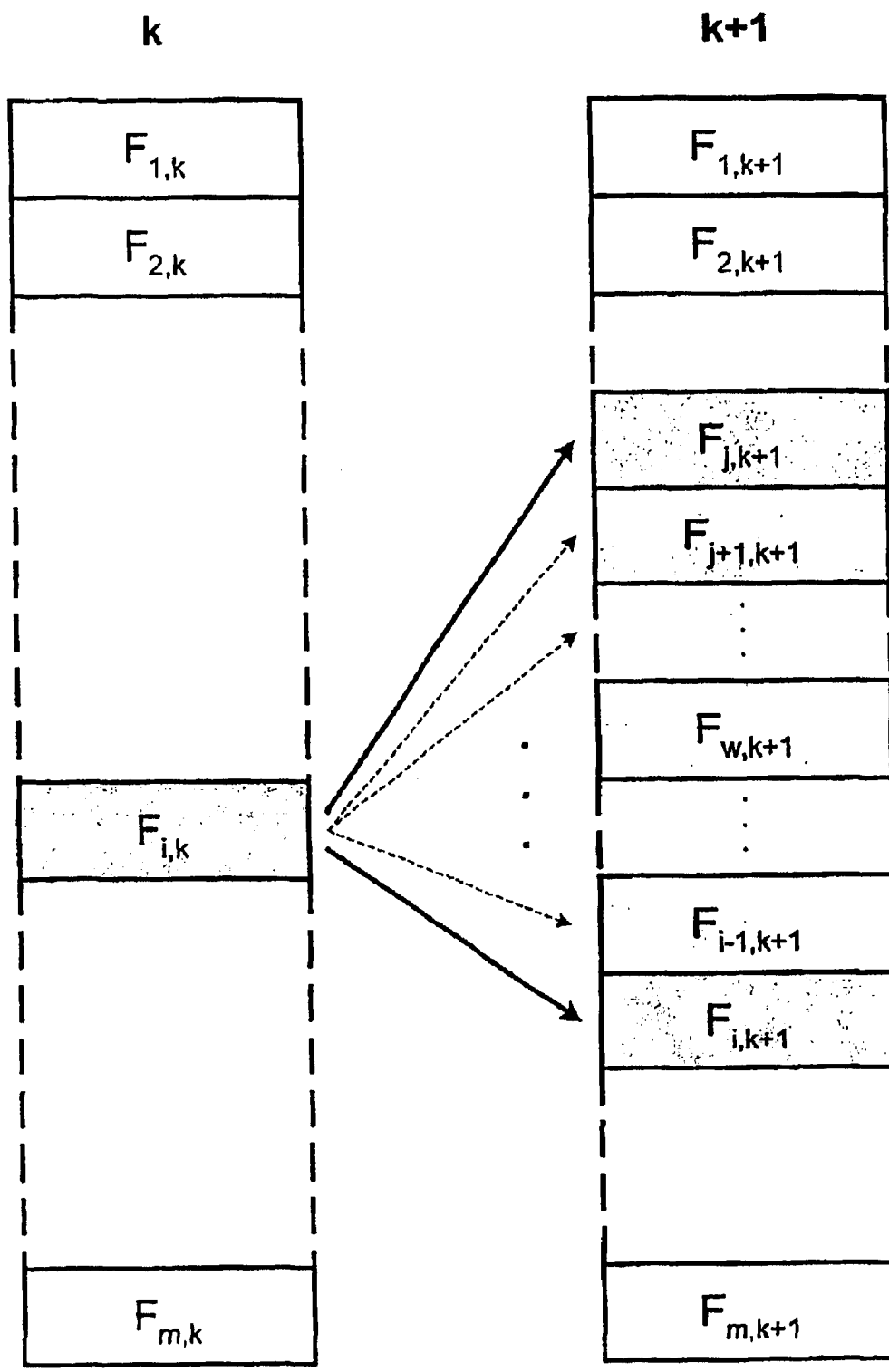
Figure 5: Variation for F table update

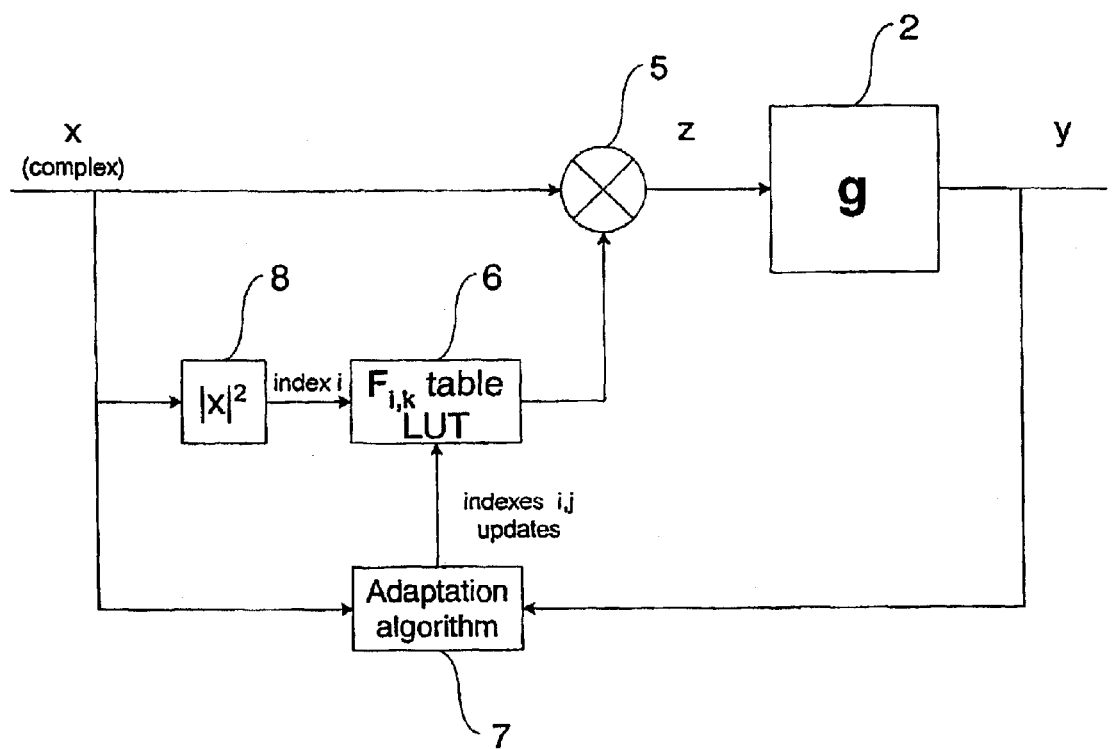
Figure 6: Predistortion block diagram

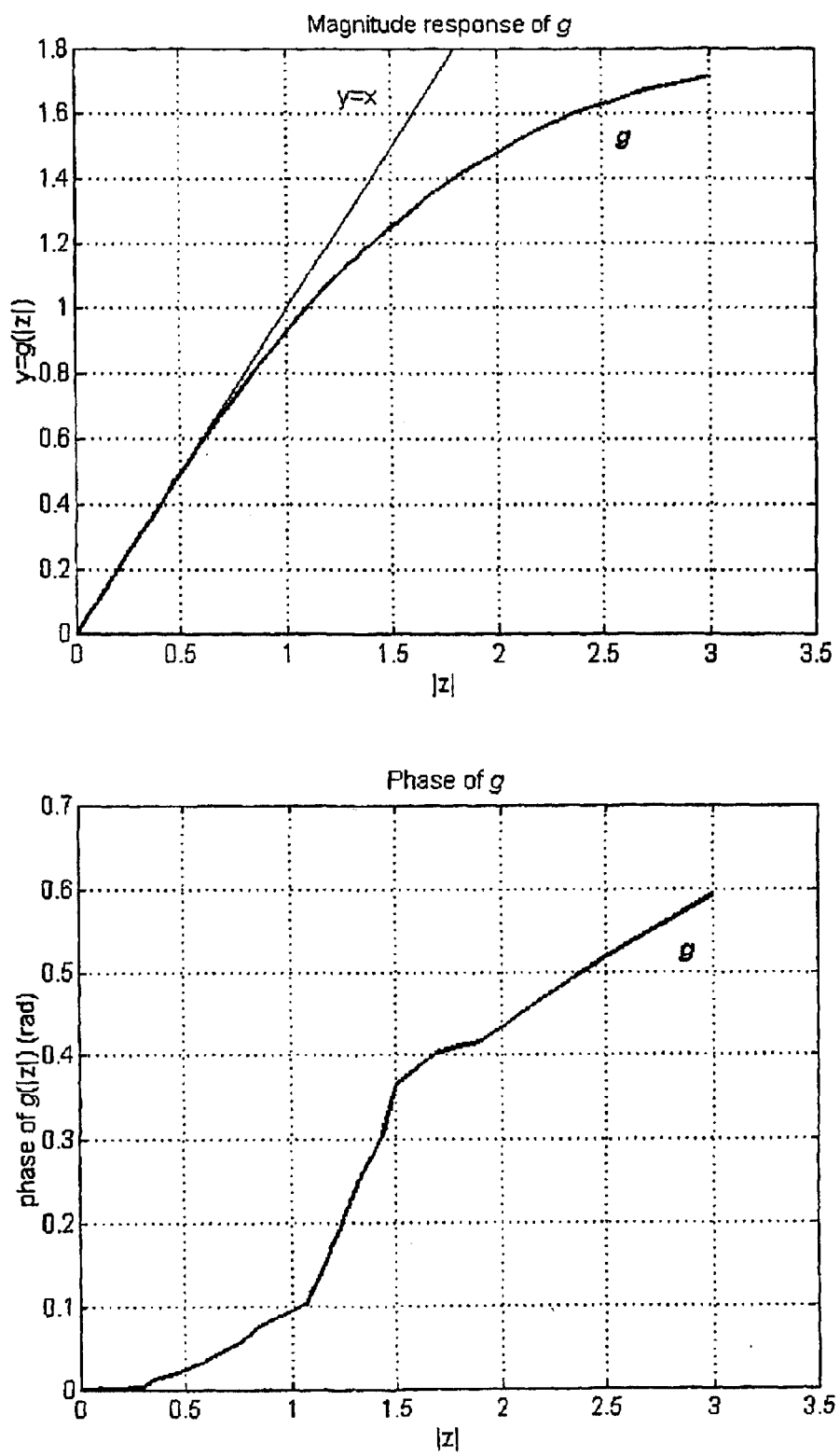
Figure 7: Magnitude and phase response of *g*

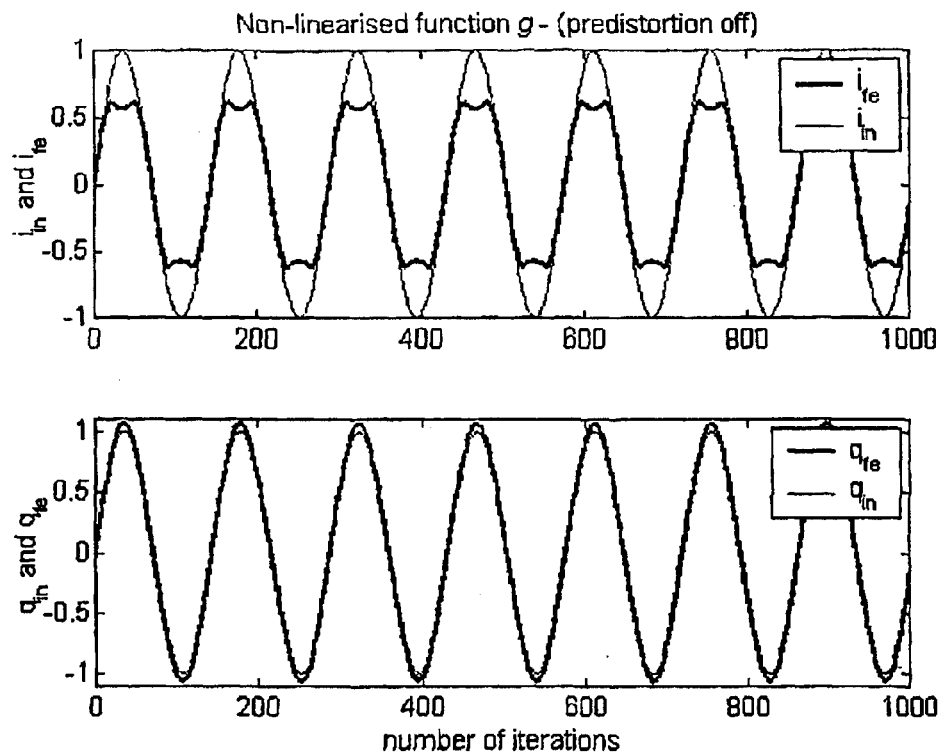
Figure 8: Non-linearised function *g* - (predistortion off)
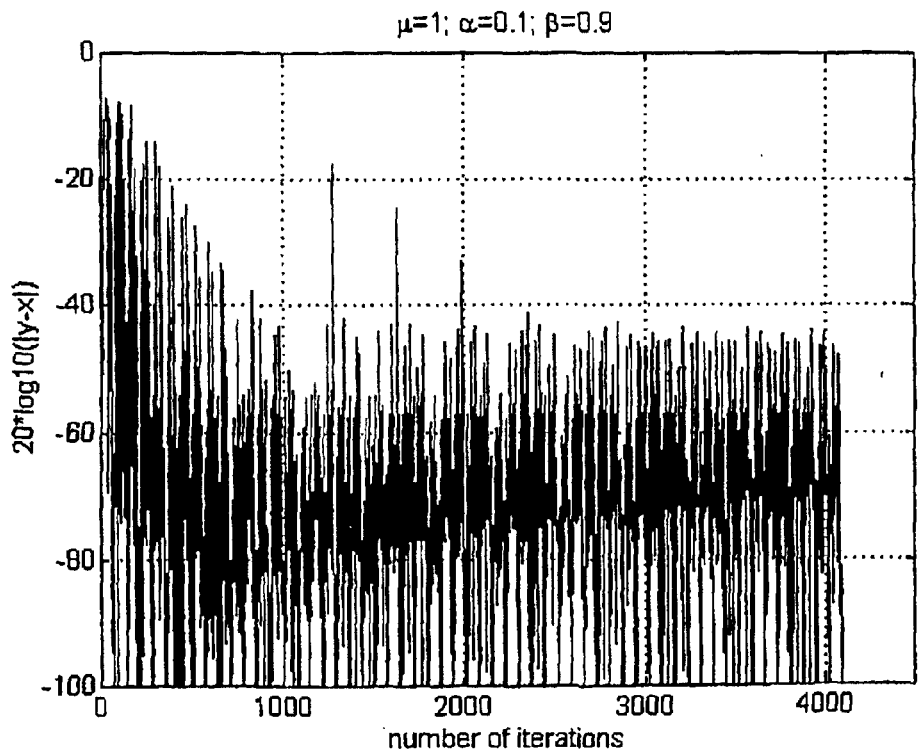
Figure 9: 20*log10(|y-x|) for the presented algorithm

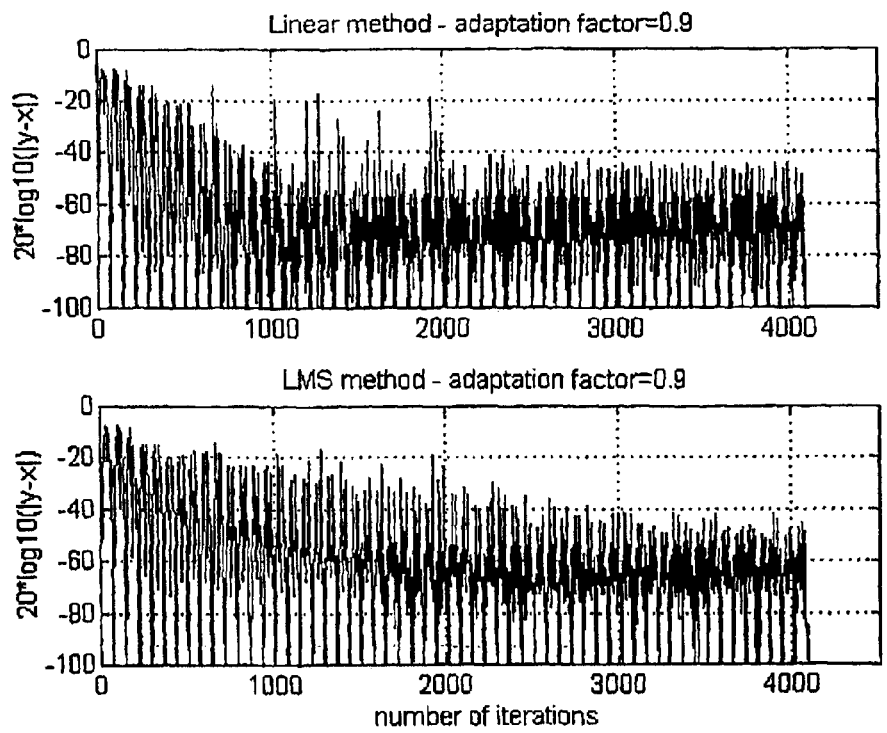
Figure 10: 20*log10(|y-x|) for linear and LMS methods
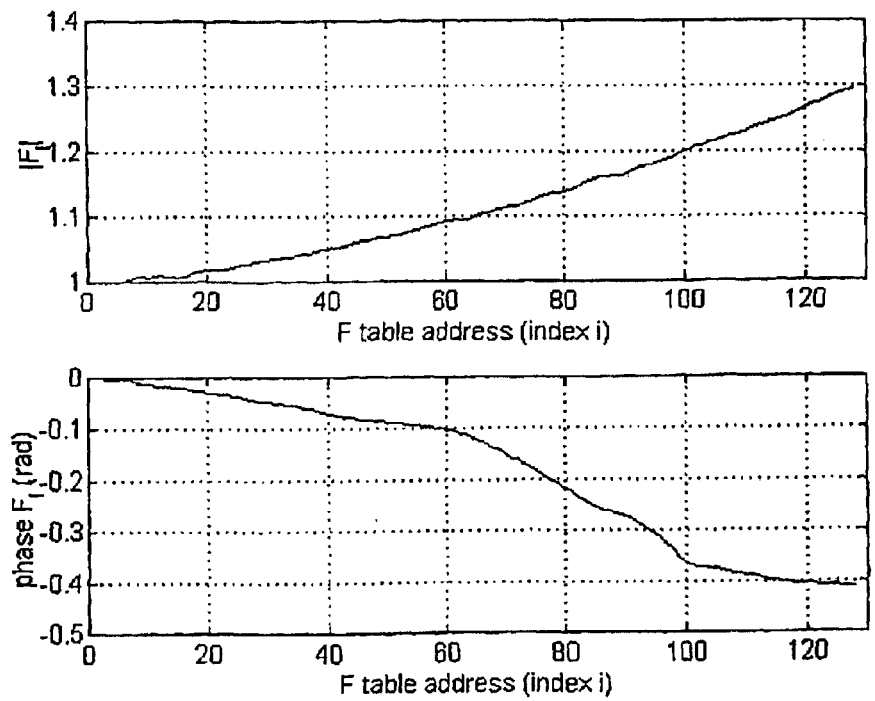
Figure 11: $F_i$ values at the end of the simulation for the presented algorithm

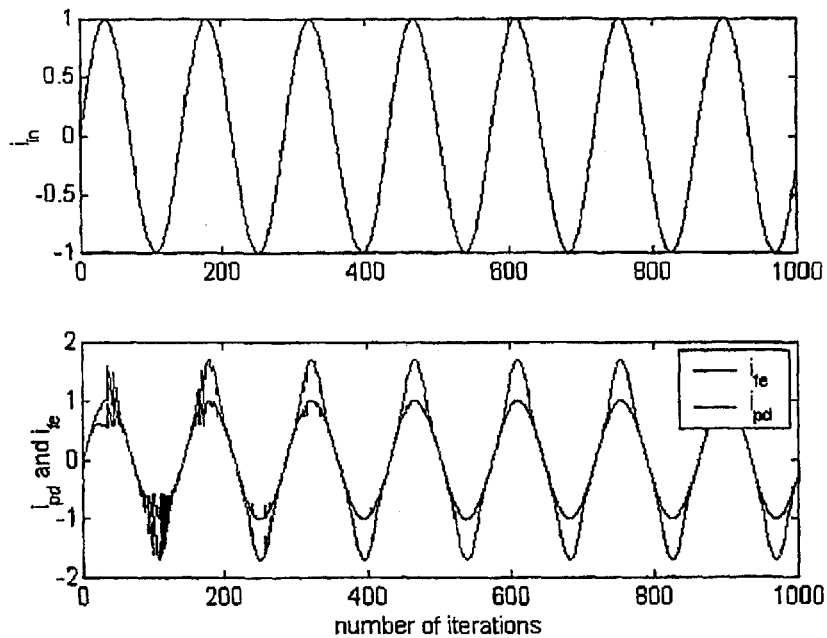
Figure 12: In-Phase components through the chain (input, predistorter out, PA out) for the presented algorithm
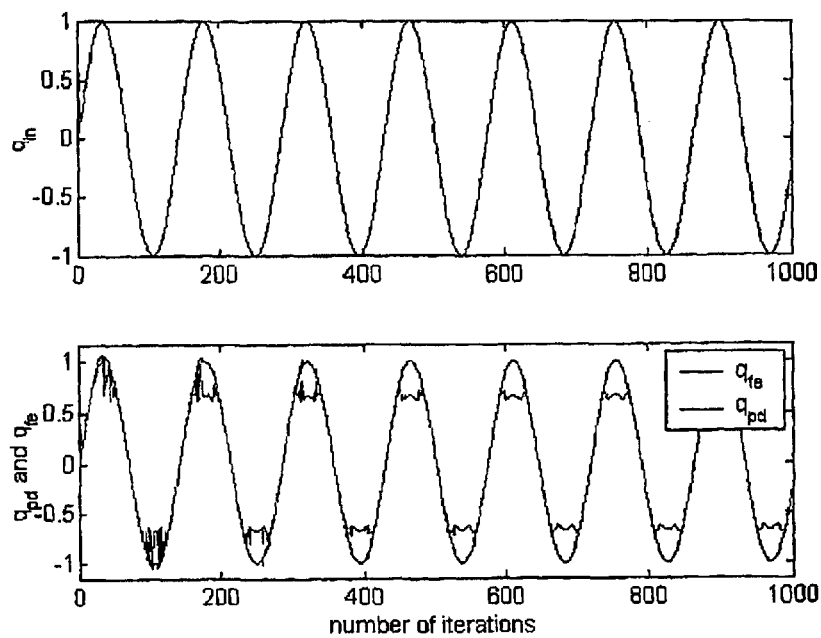
Figure 13: Quadrature components through the chain (input, predistorter out, PA out) for the presented algorithm

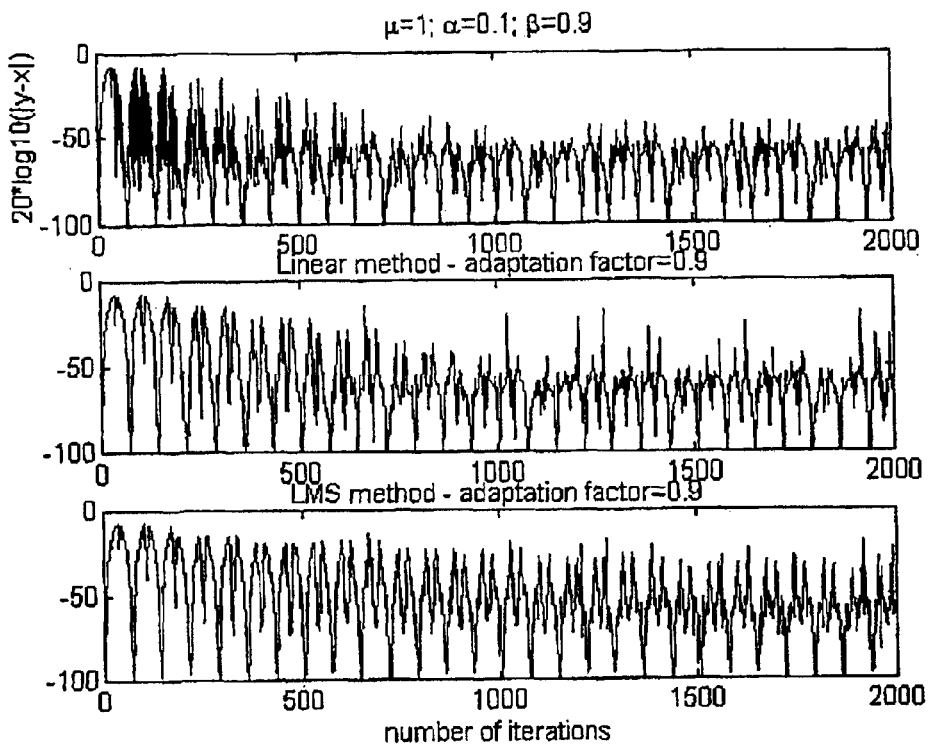
Figure 14: time varying function *g* (ramp)
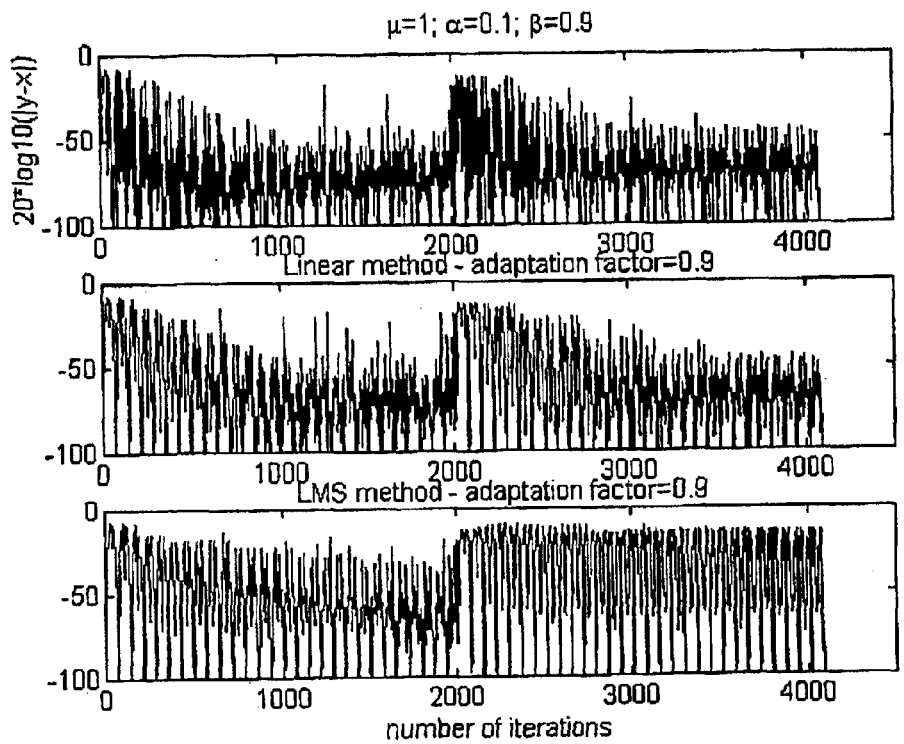
Figure 15: time varying function *g* (step)

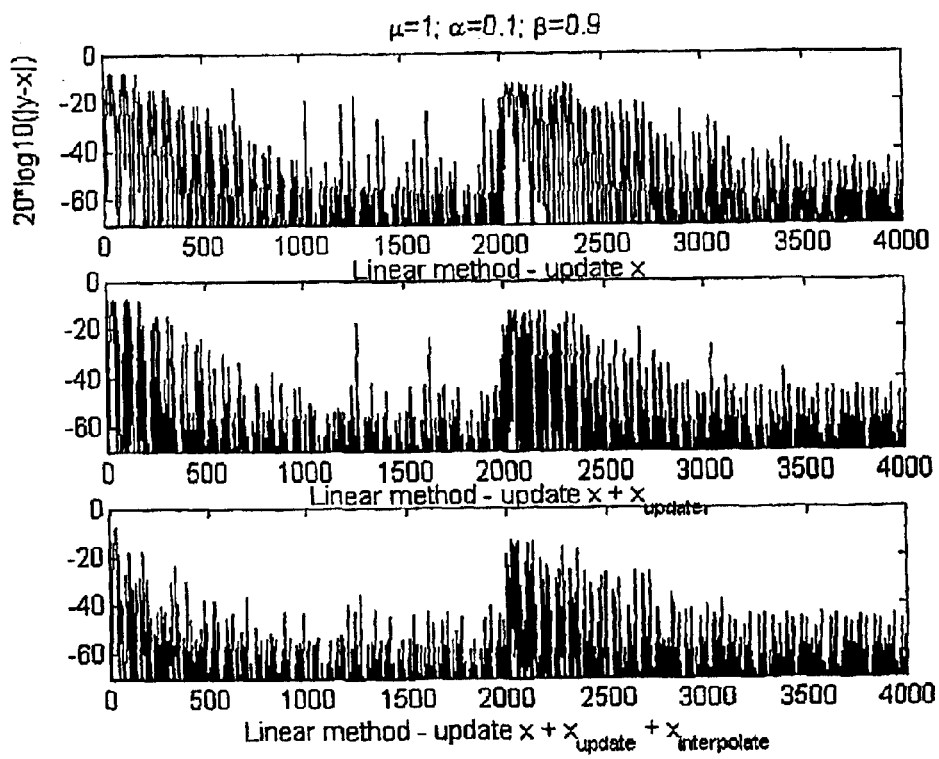
Figure 16: Three updating procedures for the linear method
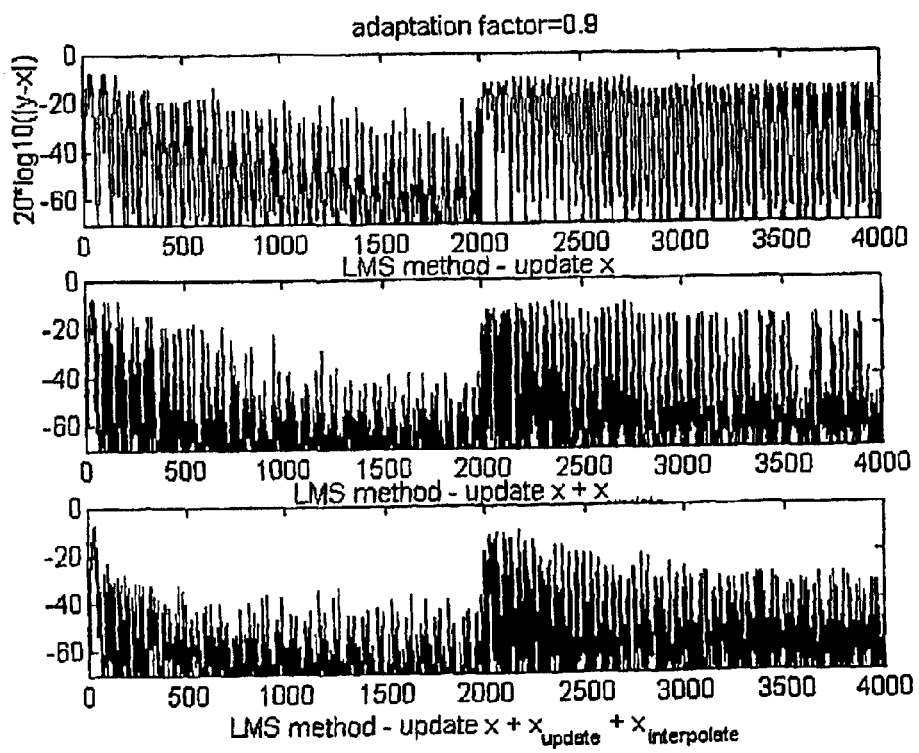
Figure 17: Three updating procedures for the LMS method

US 6,756,845 B1

METHOD AND SYSTEM FOR COMPENSATING NON-LINEARITIES AND TIME-VARYING CHANGES OF A TRANSFER FUNCTION ACTING ON AN INPUT SIGNAL

PRIORITY CLAIM

This is a national stage of PCT application No. PCT/EP00/00579, filed on Jan. 26, 2000. Priority is claimed on that application

FIELD OF THE INVENTION

The invention is directed to a method for compensating non-linearities and time-varying changes of a transfer function acting on an input signal. This input signal is first subjected to a first, adaptive transfer function and thereafter to a second, unknown and varying transfer function to generate the actual output signal. When the second transfer function varies, the first transfer function is updated for compensating these changes. The described method and system are therefore adapted to reduce the errors between an ideally expected output signal and the actually generated output signal.

BACKGROUND OF THE INVENTION

For example, in the field of mobile communications, there is sometimes the need to linearise a transmitter's non-linear characteristic, in an adaptive manner, when the characteristic exhibits slow changes caused by temperature, bias, ageing or the like. One of the existing compensating possibilities is the digital predistortion of the input signal before applying same to the transmitter's power amplifier. Thereby, the error between an ideally expected output signal and the output signal actually generated in response to a current input signal can be minimised. This need for compensation not only occurs in the field of mobile communications but also in other fields where a transfer function varying in an unknown manner is to be compensated by adapting an adaptive transfer function.

When the characteristic is changing, it takes some time until the system has been adapted to the new situation. It is desirable to perform this adaption as swiftly as possible. However, normally, a great number of iterations is necessary until the system has actually been adapted to the new characteristic.

SUMMARY OF THE INVENTION

It is therefore an object of the present invention to provide a method and system which are able to swiftly adapt to a changing transfer function and thereby quickly minimise an error between the actual output signal caused by a current input signal, and an ideally expected output signal.

The invention provides a method for compensating deviations of an unknown transfer function from an expected transfer function, and/or for compensating time-varying changes of a transfer function acting on an input signal, for minimising errors of an output signal generated in dependence on the input signal, which input signal is subjected to a first, adaptive transfer function and to a second, varying transfer function to generate the output signal, the first transfer function being updated for compensating deviations of the second transfer function from an expected transfer function and/or for compensating changes of the second transfer function, wherein, when updating one point of the first transfer function for a current input signal value, the first transfer function is also updated for at least one other point corresponding to a different input signal value.

The invention furthermore provides a system for compensating an unknown and/or varying transfer function acting on an input signal, for minimising errors of an output signal generated in dependence on the input signal, which input signal is applied via a first, adaptive compensating means having a first, adaptive transfer function, to a second means having a second, unknown and/or varying transfer function to generate the actual output signal, the first transfer function being updated for correcting deviations of the second transfer function from an expected (ideal, wanted) transfer function by means of a processing means, wherein the processing means is adapted to update, when updating one point of the first transfer function for a current input signal value, the first transfer function also at at least one other point corresponding to a different input signal value.

Due to this multi-point-correction of the first transfer function, the described method and system are able to quickly adapt the first transfer function to changes of the second transfer function and/or to quickly adapt the overall transfer function to the desired one. Thus, the apparatus swiftly converges to the new (or desired) condition, with a drastic reduction of the necessary adaption time. The occurrence of errors between an output signal ideally to be expected for a given input signal, and the actually generated output signal is therefore limited to a very short time interval after a variation (or the first use) of the second transfer function. Furthermore, the error deviations within this time interval are reduced to smaller values.

BRIEF DESCRIPTION OF THE DRAWINGS

The present invention will be more readily understood upon referring to the following description of preferred embodiments when read in conjunction with the accompanying drawings. In the drawings, FIG. 1 shows a basic configuration of a functional system, FIG. 2 shows a chart for explaining the algorithm used in the present invention, FIG. 3 shows the system of FIG. 1 in a practical implementation, FIG. 4 shows an iterative updating of two values of a transfer function, FIG. 5 illustrates the updating of a plurality of values of a transfer function, FIG. 6 shows an embodiment of the invention implemented as an adaptive predistorter and amplifier, FIG. 7 shows an example of the magnitude and phase response of function g, FIG. 8 illustrates an example of the ideally expected and actually generated output signals for a non-linearised function FIGS. 9 and 10 show simulation results for the presented algorithm and known algorithms, FIG. 11 illustrates F values calculated at the end of the simulation, FIGS. 12 and 13 show the in-phase and quadrature-phase components of input and output signals, FIGS. 14 and 15 illustrate the different convergence behaviour of the presented and known methods for different variations of the transfer function g, and FIGS. 16 and 17 show the results of three different updating procedures using the linear and LMS methods, resp.

DETAILED DESCRIPTION OF PREFERRED EMBODIMENTS OF THE INVENTION

Generally, the described adaptation algorithm is a method of minimising the error $|y-x|$ between $y=g(f(x))$ and x, where g is an unknown function and f the adaptive function for which the characteristic is changing to track g. Ideally, $f=g^{-1}$. Unlike current algorithms, it updates not only the transfer function f at the current input value x, but also the transfer function f at other points (corresponding to different input values $x_{update}$...). One of the applications for such an algorithm is digital predistortion where a transmitter's non-linear characteristic needs to be linearised, in an adaptive manner since the characteristic exhibits slow changes with temperature, bias, ageing . . . .

First, the new algorithm used in the method and system will be mathematically described.

Let us consider an unknown function g defined as:

$g:D_g \subseteq C \rightarrow C$ $x \rightarrow g(x)$

C designates the complex domain, and can be extended to an n-dimension domain; $D_g$: definition domain of g.

The adaptive function f is defined as:

$f:D_f \subseteq C \rightarrow C$ $D_f$:definition domain of f $x \rightarrow f(x)$ C:complex numbers The functions (transfer functions) f and g are performed in the order shown in FIG. 1. FIG. 1 illustrates a functional system having a compensating means 1 to which an input signal x is supplied at a first input terminal. The compensating means 1 generates an output signal z in accordance with its transfer function f (correspondence between x and z).and the value of x. The signal z is input into a second means 2 which outputs the output signal y and has a transfer function g which may change over time. The output signal y is fed back to a second input terminal of the compensating means 1. As the overall transfer function is to be maintained constant, any change of the transfer function g or deviation from the ideal transfer function will be compensated by appropriately adapting the transfer function f so as to maintain the desired relationship between x and y. The means 1 may for example be an adaptive predistorter whereas means 2 may be a power amplifier, When the desired relationship between x and y is equity (amplification gain factor=1) for example, any deviation of the gain of the amplifier 2 from the value 1 will be compensated by setting the amplification characteristic of means 1 to the reciprocal value.

The algorithm attempts, in the present example with unity gain (gain factor=1), to minimise the error |y−x
| between the output y and the input x, in an iterative process (see FIG. 2).

FIG. 2 is a diagram showing the characteristic (transfer function) g and the desired linearised overall response characteristic 3 (x=y). The horizontal axis represents the absolute value of the output z of means 1 whereas the vertical axis represents the final output y (absolute value).

In the following, $f_k(x)$ denotes f(x) at iteration k, where an iteration is the process of updating simultaneously one or more values defining the function f. It will also be written as:

$f_k(x)=x.F_{k,x}$ (with $F_{k,x} \in C$).

At iteration 0 (k=0), the transfer function f is set to 1:

$\forall x \in C, F_{0,x}=1+j.0$ (i.e., $\forall x \in C, f_0(x)=x$).

$y=g(z)=g(f_k(x))=g(x.F_{k,x})=x.F_{k,x}.G_{k,x}$ (1)

with $x.F_{k,x}=f_k(x)$ and $$G_{k,x} = \frac{y}{z} = \frac{g(x \cdot F_{k,x})}{x \cdot F_{k,x}}$$

Ideally, we would like:

$\forall x \in C, y=x$ substituting in (1), $\leftrightarrow x.F_{k,x}.G_{k,x}=x$ (2)

$\Leftrightarrow F_{opt} = \frac{1}{G_{k,x}}$ (defined as such) (3)

$F_{opt}$ would be the optimum value to use for $F_{k,x}$ to satisfy (2). Unlike previously published algorithms (linear method, secant method, Least Mean Square (LMS) etc., which have been used more specifically for predistortion systems), it is not theoretically correct to update the new value $F_{k+1,x}$ with $F_{opt}$ (even though adaptation factors are used to avoid instability). If $F_{k+1,x}=F_{opt}$ would be given, (2) would become: $x.F_{k+1,x}.G_{k,x}=x$ which is the desired result.

However, this does not take into account the fact that changing $F_{k+1,x}$ would mean $x.F_{k+1,x} \neq x.F_{k,x}$ yielding a different input to g (see FIG. 2).

Let's define $y_1$ and $Y_2$ as:

$Y_1=y=g(f_k(x))=g(x.F_{k,x})=x.F_{k,x}.G_{k,x}$ $Y_2=g(f_{k+1}(x))=g(x.F_{k+1,x})=x.F_{k+1,x}.G_{k+1,x}$ (with $F_{k+1,x}=F_{opt}$ here)

therefore $Y_2 \neq x$ because $G_{k,x} \neq G_{k+1,x}$

What really ought to be updated is the value of f corresponding to a different input $x_{update}$, while $F_{k+1,x}$ remains unchanged ($F_{k+1,x}=F_{k,x}$). $x_{update}$ is defined as:

$f_{k+1}(x_{update})=f_k(x)$ $\leftrightarrow x_{update}.F_{k+1,xupdate}=x.F_{k,x}$ with $F_{k+1,xupdate}=F_{opt}$ $\Leftrightarrow x_{update} = \frac{x \cdot F_{k,x}}{F_{opt}}$ (4)

substituting for $F_{opt}$ from (3) yields, $x_{update}=x.F_{k,x}.G_{k,x}$ (5)

comparing (5) with (1), $\leftrightarrow x_{update}=Y$ (6)

Therefore, now (iteration k+1), $x_{update}$ yields the same input to g as was x at the previous iteration (iteration k):

$f_{k+1}(x_{update}) = f_k(x)$ $\Updownarrow$ $g(f_{k+1}(x_{update})) = g(f_k(x))$
assuming g has not varied from iteration k to k+1

←→$G_{k+1,xupdate} = G_{k,x}$

←→$y_{update} = g(f_{k+1}(x_{update})) = g(x_{update} \cdot F_{k+1,xupdate}) = g(x_{update} \cdot F_{opt})$ ←→$y_{update} = g(x \cdot F_{k,x})$ from (4)

←→$y_{update} = Y$                                                      (7)

Recalling (6) and having (7), the result is $y_{update} = x_{update}$                                        (8)

which corresponds to a linearised system at point $x_{update}$ (remember the aim was to have y=x).

In this form however, the algorithm may present the danger of not updating f completely since the current $f_{k,x}$ is pointing at another value $f_{k+1,xupdate}$ to be updated. And once the latter has been updated, it will not point to another $f_{k+1,x3}$ ($x_3 \neq x_{update}$, determined in the same manner as $x_{update}$ was obtained from x) but merely to itself.

Bearing this in mind, the problem is preferably overcome by updating the current value $f_{k+1,x}$ for the current input x too. The following overall solution is suggested:

$F_{k+1,xupdate} = \mu \cdot F_{opt}$ or similar                         (a)
$F_{k+1,x}$ = chosen algorithm (linear, LMS, secant etc. ....)     (b)
where $\mu \in R$ (real numbers) and is constant („adaptation factor").

It is important to note that the key point here is to update not only the $F_{k,x}$ value corresponding to the current input x (i.e. $F_{k+1,x}$—this is done in (b)), but also $F_{k,xupdate}$ corresponding to a different value $x_{update}$ defined by (4) (i.e. $F_{k+1,xupdate}$—this is done in (a)). Hence, a different algorithm could be used to update $F_{k,x}$ ($F_{k+1,x}$), like LMS, the linear method, Recursive Least Squares (RLS) etc. In other words, the important part is (a), whereas any algorithm can be used for (b); the adjunction of (a) to (b) improves (b).

One could choose for (b):

$$F_{k+1,x} = \frac{\alpha \cdot F_{k,x} + \beta \cdot F_{opt}}{2}$$

with $(\alpha,\beta) \in R^2$.

Note that, for example, if $\alpha = \beta = \mu = 1$ and assuming the algorithm converges, the following holds true:

$$F_{k,x} \xrightarrow[k \to +\infty]{} F_{opt}$$

$\mu, \alpha, \beta$ can be chosen as a function of the input x, and therefore be different for different x inputs.

In the foregoing explanation, the equation x=y was assumed as desired relationship between x and y. In practise, however, the present algorithm can also be applied, with appropriate changes, to a more complicated dependency of y on x, for instance: $y = \lambda \cdot x$ ($\lambda \in C$, the previous description used $\lambda = 1$).

It can furthermore be envisaged to update adjacent indices to $F_{k+1,xupdate}$ as well (corresponding to other inputs), with appropriate weighting. This is because g can be assumed to have a continuous derivative (g is "smooth"); doing this results in an even faster convergence (a particular illustration is discussed in the next section below).

One possible variation consists in updating f for all values between x and $x_{update}$, by interpolation. A possible way of doing this is to use linear interpolation. Assuming $X \leq x_{update}$, $$F_{k+1,xinterpolate} = F_{k+1,x} + \frac{F_{k+1,xupdate} - F_{k+1,x}}{x_{update} - x} \cdot (x_{interpolate} - x)$$

with $x_{interpolate} \in [x, x_{update}]$

This can increase convergence speed quite considerably.

In the following, a practical implementation will be described where $D_f$ is finite.

In practise, the above described algorithm may be implemented in a computer program or in a DSP (digital signal processor), requiring digitisation. It is then suitable to limit the size of $D_f$ and define f as a list of complex values in a table which are constantly updated. The table can be multi-dimensional and the addressing customised to the application (e.g.: one could use the magnitude of the input value to address the table, or the square magnitude/power etc . . . ).

The following example is an illustration of this particular case with a one-dimensional table of size m, addressed by the magnitude of the input x. Since the table is finite, each input value x is associated with an index to the table (quantisation), fetching the corresponding value $F_{i,k}$ in the table. For example: $f_k(x) = x \cdot F_{i,k}$; $f_k(x)$ can also be produced by interpolation.

FIG. 3 shows a practical implementation of this system similar to same of FIG. 1 wherein the compensating means 1 is implemented as a table memory (here: one-dimensional look-up table) 4 which is addressed by the actual value of the input x. The values memorised in the table memory 4 are used for multiplication with the value of x for generating z, and are iteratively updated.

FIG. 4 illustrates the update process and shows, in the left part, the table contents (values $F_{1,k}$ to $F_{m,k}$) at iterative step k, whereas the right part of FIG. 4 illustrates the table contents (values $F_{1,k+1}$ to $F_{m,k+1}$) at the next iterative step k+1. The arrows between the left and right parts of FIG. 4 indicate the double updating not only of $F_{i,k+1}$ but also of $F_{j,k+1}$, corresponding to x and $x_{update}$, resp.

Applying the interpolation discussed above results in the diagram shown in FIG. 5. This can increase convergence speed considerably, however, it is computationally more complex and resource consuming. FIG. 5 illustrates the structure wherein more than two F values are updated based on the present value of x. Similar to FIG. 4, FIG. 5 shows, in the left part, the table contents (values $F_{1,k}$ to $F_{m,k}$) at iterative step k, whereas the right part of FIG. 5 illustrates the table contents (values $F_{1,k+1}$ to $F_{m,k+1}$) after the next iterative step k+1. Here, in addition to the updating not only of $F_{i,k+1}$ but also of $F_{j,k+1}$ all values of F assigned to values of x lying between x and $x_{update}$ are updated ($F_{i-1,k+1} \ldots F_{j+1,k+1}$), for example by interpolation. The plurality of arrows between the left and right half parts of FIG. 5 indicate this multi-updating based on one actual x value.

The algorithm described above has to be adapted to this application, but basically remains very similar. We can choose for instance to address the F table by the magnitude of the input x (affects look-up table resolution).

It is assumed that the input x has a known limited magnitude range: $|x| \in [|x|_{min}; |x|_{max}]$. The F table size is set accordingly to cover all the input values of x within this range. The total range of magnitude of input x is divided into subranges of possibly, but not necessarily equal size (it can for instance be a function of the input signal's statistical distribution . . . ), the number of subranges corresponding to the number m of values of F contained in the table. Therefore, each actual value of x addresses that table value F which is attributed to that subrange to which the present x belongs, for instance $F_i$. Mathematically: for $|x| \in [a_i, a_{i+1}]$, $$x \xrightleftharpoons[associated\ to]{} index\ i$$

in the F table corresponding to $F_{i,k}$ with $a_i \in R^+$, and $i \in [1 \to m]$ Hence, $f_k(x) = x.F_{i,k}$ (interpolation may be used here to determine $f_k(x)$).

The index i can be determined as:

$$i = floor\left(\frac{(m-1) \cdot |x|^2}{|x|_{max}^2}\right) + 1 \quad (9)$$

Equation (9) makes sure that the indices i range from 1 for $|x|=0$ to $i=m$ for $|x|=|x|_{max}$.

Repeating the algorithm as it has been described in part l:

$$y = g(f_k(x)) = g(x.F_{i,k}) = x.F_{i,k}.G_{i,k,x}$$

with $x.F_{i,k} = f_k(x)$ and $$G_{i,k,x} = \frac{y}{z} = \frac{g(x \cdot F_{i,k})}{x \cdot F_{i,k}}$$

$$F_{opt} = \frac{1}{G_{i,k,x}}$$

As this practical implementation of the system has a finite $D_f$, the additional index "i" is added which refers to the value F in the look-up table corresponding to cell "i" (see FIG. 4). "k" is the iteration number, whereas "x" is used as a referring index for the gain g at point $x.F_{i,k}$ which is the input to the transfer function g.

So $$x_{update} = \frac{x \cdot F_{i,k}}{F_{opt}}$$

and the associated index in the F table for $x_{update}$ is j, with $j \neq i$.

It must be ensured that $|x_{update}|$ is within the range covered by the F table (i.e., $|x|_{min} \leq |x_{update}| \leq |x|_{max} \leftarrow \to j \in [1 \to m]$).

If $|x_{update}| \leq |x|_{min}$ then j is preferably set to j=1 and if $|x|_{max} \leq |x_{update}|$ then j is preferably set to j=m. Alternatively, the F table could simply not be updated at index j for $j \neq [1 \to m]$.

Finally, the following settings are selected, similar to the above discussed case:

$$F_{j,k+1} = \mu F_{opt} \quad (i)$$

$$f_{i,k+1} = \text{chosen algorithm (linear, LMS, secant etc ...)} \quad (ii)$$

where $\mu \in R$ and is constant.

If i=j, one may choose either (i) or (ii) for the update.

This algorithm has been simulated in a system commonly referred to in the literature as predistortion.

FIG. 6 shows a predistortion block diagram. The input x is complex and has been represented as:

$$x(t) = \sin(\omega, t) + j.\sin(\omega, t) \Rightarrow \begin{cases} |x(t)| = \sqrt{2} \times |\sin(\omega, t)| \\ \angle x(t) \equiv \frac{\pi}{4}[\pi] \end{cases}$$

$\omega = 2 \times \pi \times 8.751e3\ rad.s^{-1}$.

Sampling time=iteration frequency=200e3 Hz.
F table size is m=128.

(The expression "e3" means a multiplication by a factor $10^3$).

In FIG. 6 and the following figures, the following applies:

$i_{in} = Re(x); q_{in} = Im(x)$ [input-$x$]

$i_{pd} = Re(z); q_{pd} = Im(z)$ [predistorter out-$f(x)$]

$i_{fe} = Re(y); q_{fe} = Im(y)$ ["PA out"-$g(f(x))$]

(PA=power amplifier).

The adaptive predistorter amplifier shown in FIG. 6 comprises a multiplier 5 to which the input signal x and the output of a look-up table (memory) 6 is applied. The contents of look-up table 6 correspond to the table shown in FIG. 4 or 5. Thus, the output signal of look-up table 6 is the $F_{i,k}$ value selected according to the present amplitude of input signal x. The multiplier 5 generates, as its output, the signal z which is applied to means. 2, similar as in FIGS. 1 and 3. Here, the means 2 is an amplifier having a time-varying gain characteristic. The output signal y of means 2 and the input signal x are supplied to a processing means 7 which stores and processes the above described adaptation algorithm. Updates for the indices i, j, etc ..., i.e. F values $F_{i,k+1}, F_{j,k+1}$, etc ... for the present iteration step "k+1" are calculated within processing means 7 based on the algorithm and are then supplied from processing means 7 to the look-up table 6 for storage therein, replacing the previous respective values (see FIG. 4 or 5).

The complex input x is not only supplied to processing means 7 but also to a squaring means 8 which generates the square value of the absolute value of input x. The output of squaring means 8 is connected to an input of look-up table 6. The present output value of squaring means 8 is used as address (index i) for selecting the $F_{i,k}$ value to be updated, so that same is selected depending on the square of the absolute value of x. This selected F value and the at least one further F value (see FIG. 4 or 5) are then updated according to the calculation results of processing means 7.

The characteristic of g (means 2) is shown in FIG. 7. The upper diagram of FIG. 7 represents the magnitude response of g (horizontal axis: absolute value of input signal z; vertical axis: output $y=g(|z|)$) whereas the lower diagram illustrates the phase response of g (horizontal axis: absolute value of input signal z; vertical axis: phase of $g(|z|)$ in radians).

These curves correspond to typical measured data for a given RF power amplifier (data has been normalised). Typically, such an amplifier will produce essentially AM to AM and AM to PM distortion.

For reference, FIG. 8 shows the input and output signals for a non-linearised function g (i.e., $\forall x \in C, f_k(x) = x \leftarrow \to \forall (i, k) \in [1 \to m] \times N, F_{i,k}(x) = 1+j.0 \to y = g(f(x)) = g(x))$ with predistortion being switched off. The upper diagram of FIG. 8 illustrates the time-behaviour of the real parts of input x ($i_{in} = Re(x)$) and output y ($i_{fe} = Re(y)$) with regard to the number of iterations (horizontal axis). The lower diagram of FIG. 8 illustrates the time-behaviour of the imaginary parts of input x ($q_{in} = Im(x)$) and output y ($q_{fe} = Im(y)$) with regard to the number of iterations (horizontal axis). Here, we are aiming at a gain factor of 1 so the input signals are similar to the ideally expected output signals.

Let us first consider a case where the function g is unknown but time-invariant. Its transfer function is shown in FIG. 7. The simulations provided in the following figures compare the results for the novel algorithm described above, with same achieved when applying the linear method, and the LMS method. For the presented algorithm, the factors are selected as follows: $\mu=1$; $\alpha=0.1$; $\beta=0.9$.

For the linear method: adaptation factor=0.9.

For the LMS method: adaptation factor=0.9.

Note that the choice of coefficients is such that the presented algorithm is an enhancement of the chosen method in the simulated examples here (i.e. referring to what was explained above): the presented algorithm corresponds to (a)=($F_{k+1,xupdate}=\mu.F_{opt}$) and (b)=($F_{k+1,x}$=chosen algorithm (linear, LMS, secant etc . . . )), whereas the chosen method is (b) only.

FIG. 9 illustrates the convergence of error values ($|y-x|$) logarithmically plotted, as $20*\log10(|y-x|)$, over the number of iterations for the presented algorithm. For comparison, FIG. 10 shows the error values ($|y-x|$), plotted as $20*\log10(|y-x|)$, over the number of iterations, for the linear method (upper diagram) and the LMS method (lower diagram).

FIG. 11 illustrates the $F_i$ values at the end of the simulation for the presented algorithm. The upper diagram shows the absolute values of $F_i$ for all table addresses. As shown, the $F_i$ values monotonically increase from "1" for the lowest address to approx. "1.3" for the highest addresses. The lower diagram shows the phase values of $F_i$ for all table addresses.

FIG. 12 illustrates the in-phase components through the chain (input, predistorter out, PA out (PA=power amplifier)) for the presented algorithm. The upper diagram shows the real part of input x over the number of iterations whereas the lower diagram shows the real parts of signals z and y.

FIG. 13 illustrates, similar to FIG. 12, the quadrature components through the chain (input, predistorter out, PA out) for the presented algorithm. The upper diagram shows the imaginary part of input x over the number of iterations whereas the lower diagram shows the imaginary parts of signals z and y.

It can be seen from the simulations that the presented algorithm presents faster convergence than the linear method or the LMS method.

Next, let us consider a case wherein g increases monotonically with time.

The new unknown transfer function $g_{1,2}$ is defined as a ramp of slope 1 multiplied by the previous transfer function g: $g_{1,2}(t,x)=g(t\times x)$ where g is the same function as defined in FIG. 7.

Again, FIG. 14 presents the results for this time varying function g (ramp) for all three methods, with the inscriptions of the horizontal and vertical axes similar to same of FIGS. 9, 10.

Here again, the proposed algorithm reveals to converge faster and hence to be more robust against slow variations of the function g (gain).

In the next considered case, the transfer function g is a time varying function g in form of a step. This new transfer function $g_{1,3}$, is defined as the previous function g multiplied by a step function:

$g_{1,3}(t,x)=g(l\times x)$ for $0 \leq t \leq 0.01$ ($t=0.01 \leftarrow\rightarrow$iteration 2000)

$g_{1,3}(t,x)=g(1.2\times x)$ for $0.01\leq t$

FIG. 15 presents the results for all three methods.

This case attempts to test the response of the algorithm for sudden variations of g. The proposed method again converges the quickest. Note that the LMS method is quite slow to readapt.

A comparison for g as a step (same as above) is done for the linear method and the LMS method for the three following algorithms (FIGS. 16 and 17):

1) Updating current x address only (index i);
2) Updating current x (index i) and $x_{update}$ (index j) addresses;
3) Updating current x (index i), $x_{update}$ (index j) and all $x_{interpolate}$ addresses between x and $x_{update}$ (indices w with we[j→i] if j≦i for example).

The algorithm 1) is the known one whereas algorithms 2) and 3) are in accordance with the present invention.

FIG. 16 shows the three updating procedures using the linear method, whereas FIG. 17 shows the three updating procedures using the LMS method. The upper diagram illustrates algorithm 1), the middle diagram algorithm 2), and the lower diagram algorithm 3).

It is obvious that algorithm 2) has a better convergence speed than algorithm 1), and that algorithm 3) yet improves this speed dramatically. Interpolation used in algorithm 3) relies on the assumption of a "well-behaved" response for g, which becomes even more plausible as the algorithm converges. In general, for a power amplifier, this is a fair assumption.

The algorithm described here thus provides, compared to other algorithms used for predistortion systems such as the linear method or the LMS method, very fast convergence, and is quite robust against fluctuations of g in time. Besides, it requires few operations (i.e. is computationally simple), and can be used in conjunction with other algorithms as an enhancement.

The use of spectrally more efficient modulation schemes (higher throughput/occupied bandwidth ratio) to accommodate higher data rates in communications often introduces both phase and magnitude variations of the signal, thus requiring stringent linearity of the transceiver to preserve signal integrity. Transmitter linearisation, in particular, is then often necessary to provide good linearity while offering reasonable power efficiency.

Satellite and mobile applications are two potential candidates for linearisation. The proposed algorithm can, for instance, be used within digital predistortion systems as a linearisation means. The present invention can therefore be embodied in a stationary or mobile device for mobile communications, in particular in a RF transmitter thereof, in such standards as GSM EDGE (Global System for Mobile Communications Enhanced Data Rates for GSM Evolution), TETRA (Terrestrial Trunked Radio), CDMA (Code Division Multiple Access), W-CDMA (Wideband-CDMA), NADC (North American Digital Cellular), PDC (Personal Digital Cellular) . . .

An embodiment is therefore a stationary or mobile apparatus for mobile communications containing a device as shown in FIG. 3 or 6.

What is claimed is:

1. Method for compensating deviations of an unknown transfer function from an expected transfer function, and/or for compensating time-varying changes of a transfer function acting on an input signal, for minimising errors of an output signal generated in dependence on the input signal, which input signal is subjected to a first, adaptive transfer function and to a second, unknown and/or varying transfer function to generate the output signal, the first transfer function being updated for compensating deviations or changes of the second transfer function, wherein, when updating one point of the first transfer function for a current input signal value, the first transfer function is also updated for at least one other point corresponding to a different input signal value.

2. Method according to claim 1, wherein the at least one other point of the first transfer function is calculated in dependence on the current input signal value and the value of the first transfer function at this input signal value.

3. Method according to claim 1, wherein the at least one other point of the first transfer function is calculated in additional dependence on the respective value of the second transfer function.

4. Method according to claim 1, wherein the at least one other point of the first transfer function is corrected in dependence on the value of the second transfer function for the current input signal value.

5. Method according to claim 4, wherein the at least one other point of the first transfer function is corrected by multiplying the value of the second transfer function for the current input signal value, with a factor.

6. Method according to claim 1, wherein values of the first transfer function lying adjacent to the one point of the first transfer function and/or the at least one other point of the first transfer function are also corrected with appropriate weighting.

7. Method according to claim 6, wherein values of the first transfer function lying between the one and the at least one other point of the first transfer function are corrected by interpolating.

8. Method according to claim 1, wherein the values of the first transfer function are provided in the form of a table being addressed by the input signal values.

9. Method according to claim 1, wherein the updating of the first transfer function is done in an iterative manner.

10. System for compensating deviations of an unknown transfer function from an expected transfer function, and/or for compensating time-varying changes of a transfer function acting on an input signal, for minimising errors of an output signal generated in dependence on the input signal, which input signal is applied via a first, adaptive compensating means having a first, adaptive transfer function, to a second means having a second, unknown and/or varying transfer function to generate the actual output signal, the first transfer function being updated for compensating deviations and/or changes of the second transfer function by means of a processing means, wherein the processing means is adapted to update, when updating one point of the first transfer function for a current input signal value, the first transfer function also at at least one other point corresponding to a different input signal value.

11. Use of the method according to claim 1 to perform linearisation of a signal path.

12. Method according to claim 2, wherein the at least one other point of the first transfer function is calculated in additional dependence on the respective value of the second transfer function.

13. Method according to claim 2, wherein the at least one other point of the first transfer function is corrected in dependence on the value of the second transfer function for the current input signal value.

14. Method according to claim 3, wherein the at least one other point of the first transfer function is corrected in dependence on the value of the second transfer function for the current input signal value.

15. Method according to claim 2, wherein values of the first transfer function lying adjacent to the one point of the first transfer function and/or the at least one other point of the first transfer function are also corrected with appropriate weighting.

16. Method according to claim 3, wherein values of the first transfer function lying adjacent to the one point of the first transfer function and/or the at least one other point of the first transfer function are also corrected with appropriate weighting.

17. Method according to claim 4, wherein values of the first transfer function lying adjacent to the one point of the first transfer function and/or the at least one other point of the first transfer function are also corrected with appropriate weighting.

18. Method according to claim 5, wherein values of the first transfer function lying adjacent to the one point of the first transfer function and/or the at least one other point of the first transfer function are also corrected with appropriate weighting.

19. Method according to claim 2, wherein the values of the first transfer function are provided in the form of a table being addressed by the input signal values.

20. Method according to claim 3, wherein the values of the first transfer function are provided in the form of a table being addressed by the input signal values.

21. Method according to claim 4, wherein the values of the first transfer function are provided in the form of a table being addressed by the input signal values.

22. Method according to claim 5, wherein the values of the first transfer function are provided in the form of a table being addressed by the input signal values.

23. Method according to claim 6, wherein the values of the first transfer function are provided in the form of a table being addressed by the input signal values.

24. Method according to claim 7, wherein the values of the first transfer function are provided in the form of a table being addressed by the input signal values.

25. Method according to claim 2, wherein the updating of the first transfer function is done in an iterative manner.

26. Method according to claim 3, wherein the updating of the first transfer function is done in an iterative manner.

27. Method according to claim 4, wherein the updating of the first transfer function is done in an iterative manner.

28. Method according to claim 5, wherein the updating of the first transfer function is done in an iterative manner.

29. Method according to claim 6, wherein the updating of the first transfer function is done in an iterative manner.

30. Method according to claim 7, wherein the updating of the first transfer function is done in an iterative manner.

31. Method according to claim 8, wherein the updating of the first transfer function is done in an iterative manner.

32. Use of the system according to claim 10 to perform linearisation of a signal path.

* * * * *